US012292769B2

(12) United States Patent
Zhou et al.

(10) Patent No.: US 12,292,769 B2
(45) Date of Patent: May 6, 2025

(54) FIXTURE FOR FIXING STRUCTURES WITH EXPANSION CARDS, AND ELECTRONIC EQUIPMENT

(71) Applicant: Fulian Precision Electronics (Tianjin) Co., LTD., Tianjin (CN)

(72) Inventors: San-Long Zhou, Tianjin (CN); Yang Li, Tianjin (CN); Gong-Wen Zhang, Tianjin (CN); Jun Li, Shenzhen (CN)

(73) Assignee: Fulian Precision Electronics (Tianjin) Co., LTD., Tianjin (CN)

( * ) Notice: Subject to any disclaimer, the term of this patent is extended or adjusted under 35 U.S.C. 154(b) by 253 days.

(21) Appl. No.: 18/127,537

(22) Filed: Mar. 28, 2023

(65) Prior Publication Data

US 2023/0315169 A1 Oct. 5, 2023

(30) Foreign Application Priority Data

Mar. 30, 2022 (CN) .......................... 202210334444.3

(51) Int. Cl.
*G06F 1/18* (2006.01)
*F16M 13/02* (2006.01)

(52) U.S. Cl.
CPC ............ *G06F 1/186* (2013.01); *F16M 13/02* (2013.01)

(58) Field of Classification Search
CPC ...................................... G06F 1/186
USPC ..................................... 361/679.32
See application file for complete search history.

(56) References Cited

U.S. PATENT DOCUMENTS

| 8,514,585 | B2 * | 8/2013 | Zhang | H05K 5/0269 361/801 |
|---|---|---|---|---|
| 9,921,616 | B1 * | 3/2018 | Yuan | G06F 1/185 |
| 10,624,226 | B1 * | 4/2020 | Alvarado | H05K 7/1408 |
| 11,744,032 | B2 * | 8/2023 | Yu | H05K 7/1418 361/679.01 |
| 2002/0093797 | A1 * | 7/2002 | Willis | G06F 1/181 361/752 |
| 2004/0252471 | A1 * | 12/2004 | Barsun | G06F 1/185 361/801 |
| 2005/0152122 | A1 * | 7/2005 | Fan | H05K 7/1409 361/752 |
| 2023/0225069 | A1 * | 7/2023 | Ciou | G06F 1/184 361/752 |

* cited by examiner

*Primary Examiner* — Adrian S Wilson
(74) *Attorney, Agent, or Firm* — ScienBiziP, P.C.

(57) ABSTRACT

A fixture and electronic equipment for rapid assembly and disassembly of expansion cards. The fixture comprises a holder, a bracket, a first connector, and a second connector. The holder is configured to fix the expansion card. The first connector is positioned on the holder. A first slot is defined on the bracket. The first connector enters the first slot. Two walls of the first slot are stopped on opposite sides of the first connector along the second direction. The bracket supports the holder along the third direction. The second connector is positioned on the holder. A socket is defined on the bracket. The second connector is insertable into the socket to limit the holder from moving relative to the bracket along the first direction. The first direction, the second direction, and the third direction are perpendicular to each other.

20 Claims, 5 Drawing Sheets

FIXTURE FOR FIXING STRUCTURES WITH EXPANSION CARDS, AND ELECTRONIC EQUIPMENT

FIELD

The subject matter herein generally relates to a fixed device, in particular to a fixture for fixing structures with expansion cards, and electronic equipment.

BACKGROUND

Expansion cards, such as PCIe cards (peripheral component interconnect express), are generally fixed on servers using screws. PCIe cards are inserted into the PCIe interface, and then locked onto electronic equipment using screws. The requirements for fault handling efficiency are increasingly high. When repairing or replacing a PCIe card, it is necessary to use tools to complete the disassembly and re-assembly of the PCIe card, causing great inconvenience to the consumers and maintenance personnel and the process is time consuming. There is an urgent need to provide a fixed structure for a fast and tool free installation and disassembly of the PCIe cards.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the disclosure. Moreover, in the drawings, like reference numerals designate corresponding parts throughout the several views.

DETAILED DESCRIPTION

Figure 1:
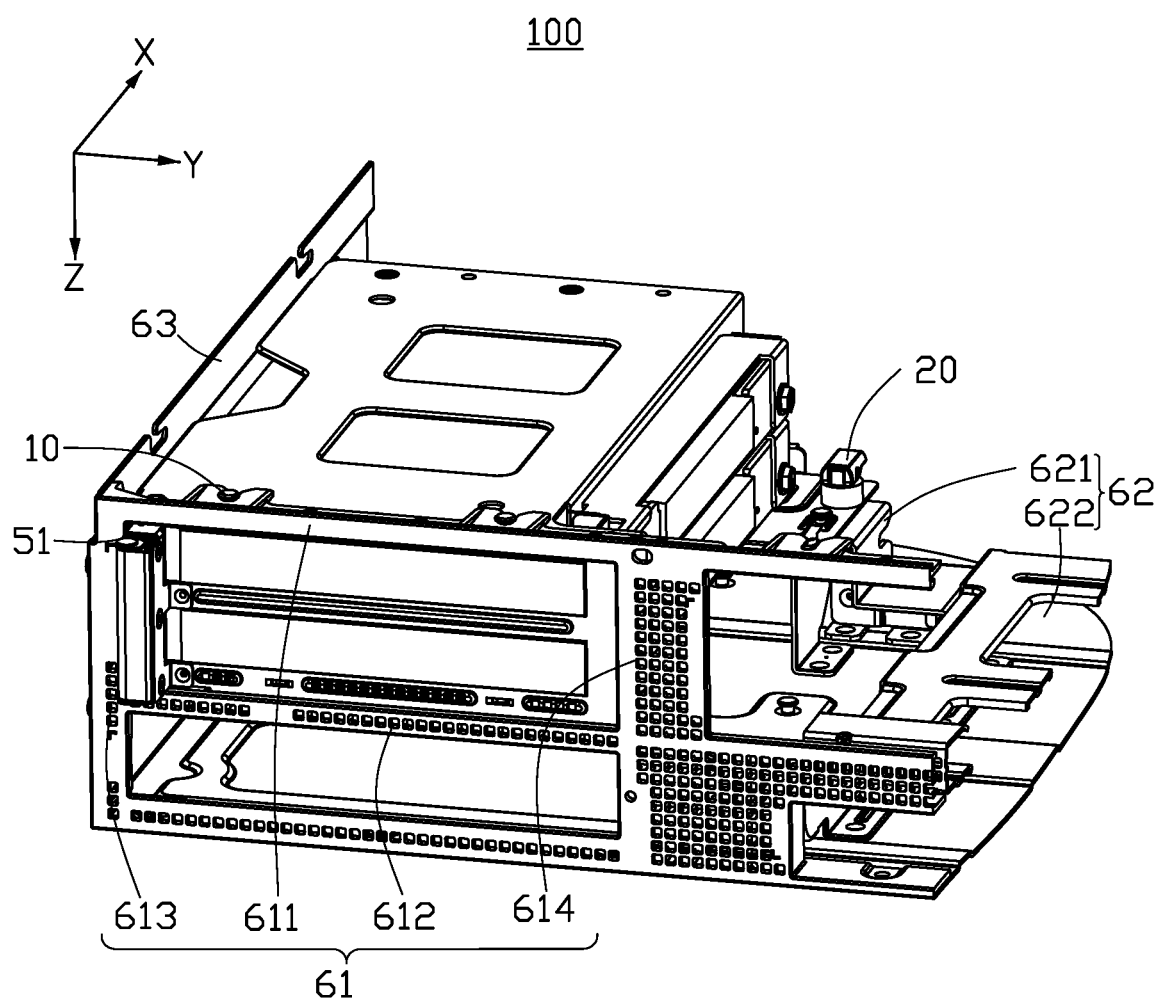
FIG. 1 is an isometric, assembled view of a fixture provided by an embodiment of the present application.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

The present disclosure, including the accompanying drawings, is illustrated by way of examples and not by way of limitation. Several definitions that apply throughout this disclosure will now be presented. It should be noted that references to "an" or "one" embodiment in this disclosure are not necessarily to the same embodiment, and such references mean "at least one."

The term "coupled" is defined as connected, whether directly or indirectly through intervening components, and is not necessarily limited to physical connections. The connection can be such that the objects are permanently connected or releasably connected. The term "comprising" means "including, but not necessarily limited to"; it specifically indicates open-ended inclusion or membership in a so-described combination, group, series, and the like.

Without a given definition otherwise, all terms used have the same meaning as commonly understood by those skilled in the art. The terms used herein in the description of the present disclosure are for the purpose of describing specific embodiments only, and are not intended to limit the present disclosure.

Figure 2:
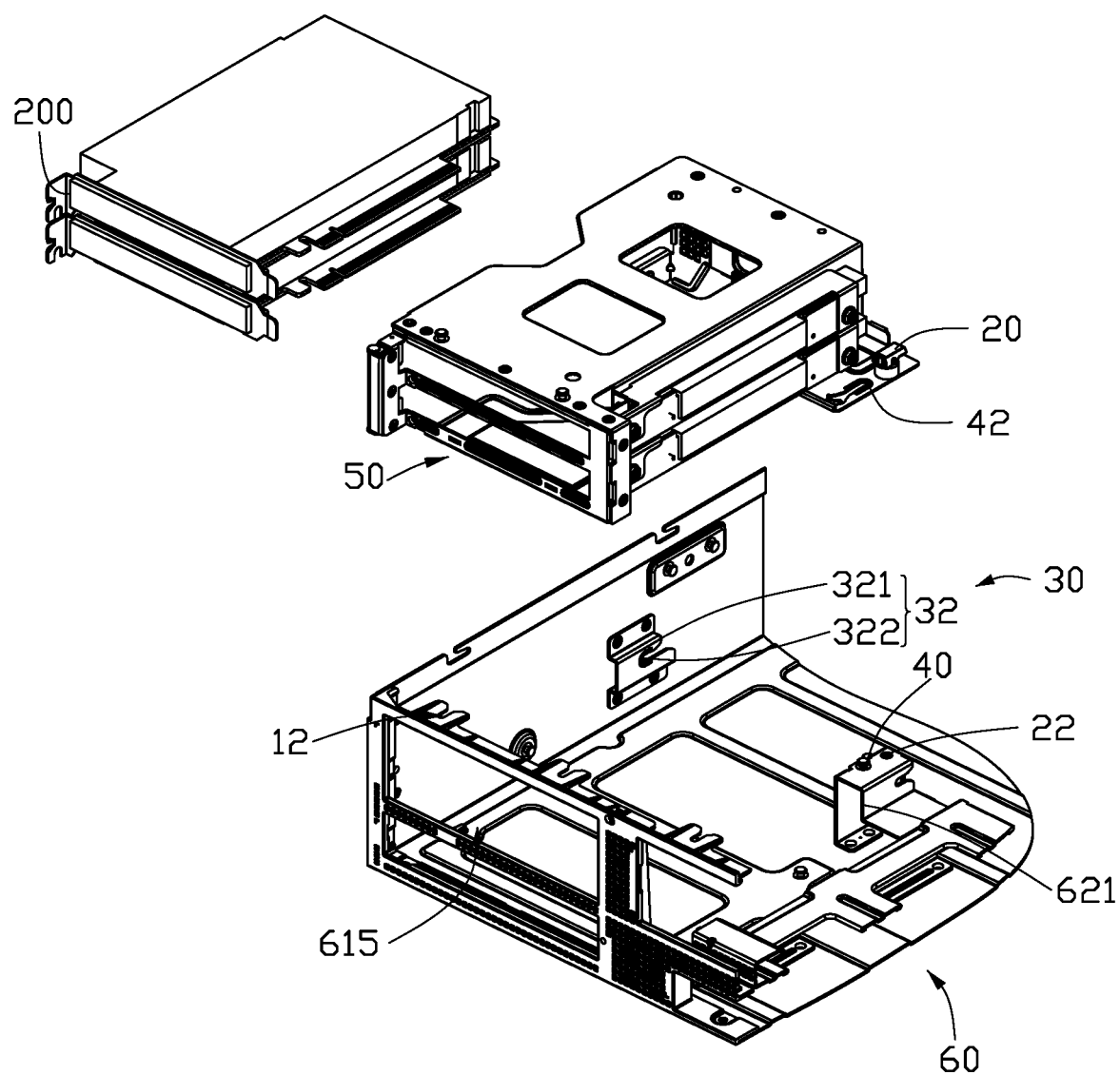
FIG. 2 is an isometric, exploded view of the fixture shown in FIG. 1, showing a cover and a quick release structure.

As shown in FIG. 1 and FIG. 2, an embodiment of the present application provides a fixture 100 that could be tool free to install and disassemble the expansion card 200 to facilitate to improve the efficiency of machine assembly and maintenance.

The fixture 100 comprises a holder 50, a bracket 60, a first connector 10, and a second connector 20. The holder 50 is configured to fix the expansion card 200. The bracket 60 is configured to fix the holder 50.

The expansion card 200 is mainly configured for electrical connection with a circuit board to expand the circuit board performance. For example, the expansion card 200 comprises at least one of a PCIe card, a PCI card, a network card, a graphics card, an adapter card, a PCIe acquisition card, and other components with similar functions.

For ease of description, the length direction of holder 50 is defined as first direction X, the width direction of holder 50 is defined as second direction Y, and the thickness direction of holder 50 is defined as third direction Z.

Figure 3:
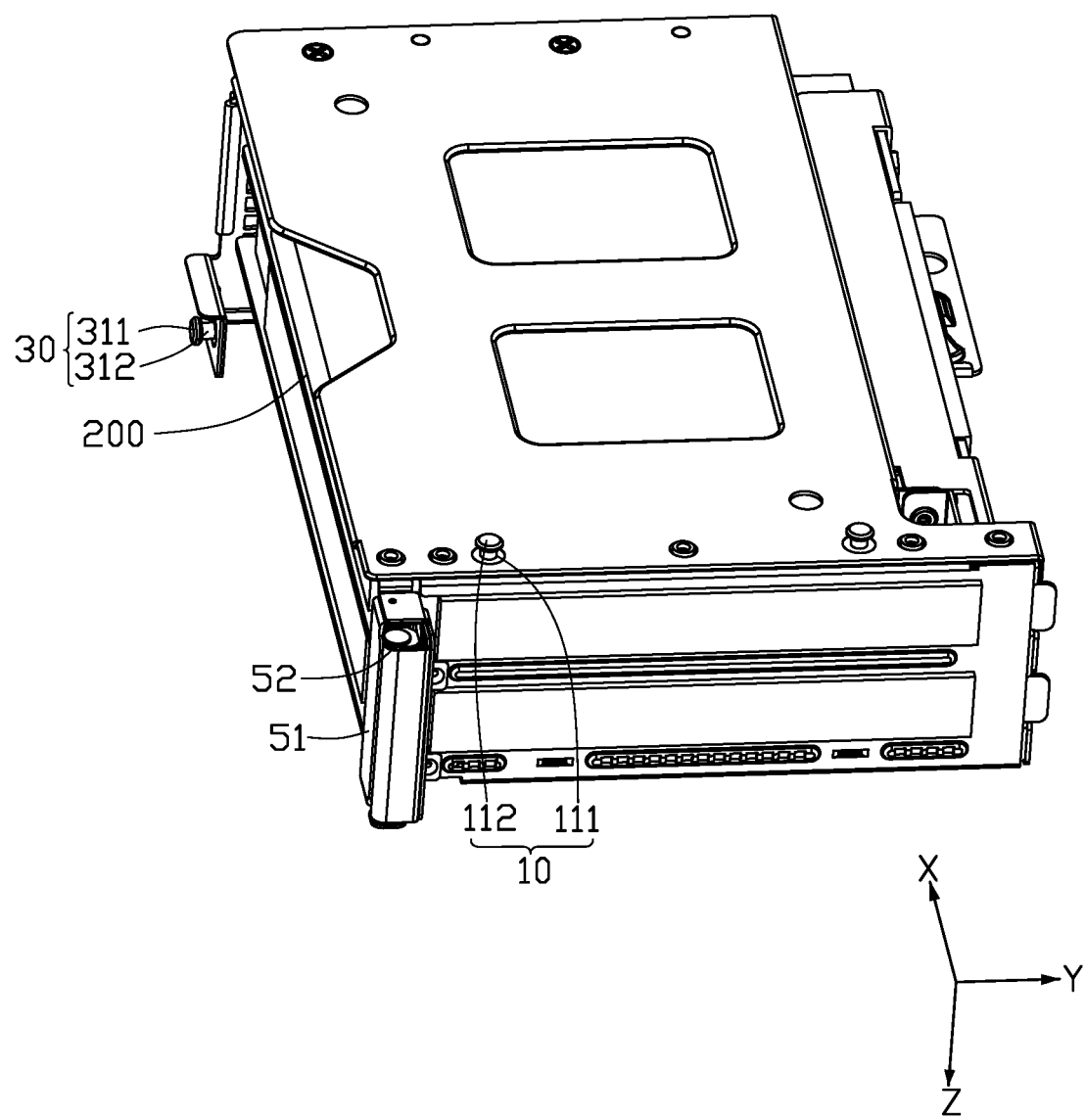
FIG. 3 is an isometric view of a holder in the fixture shown in FIG. 1.
Figure 5:
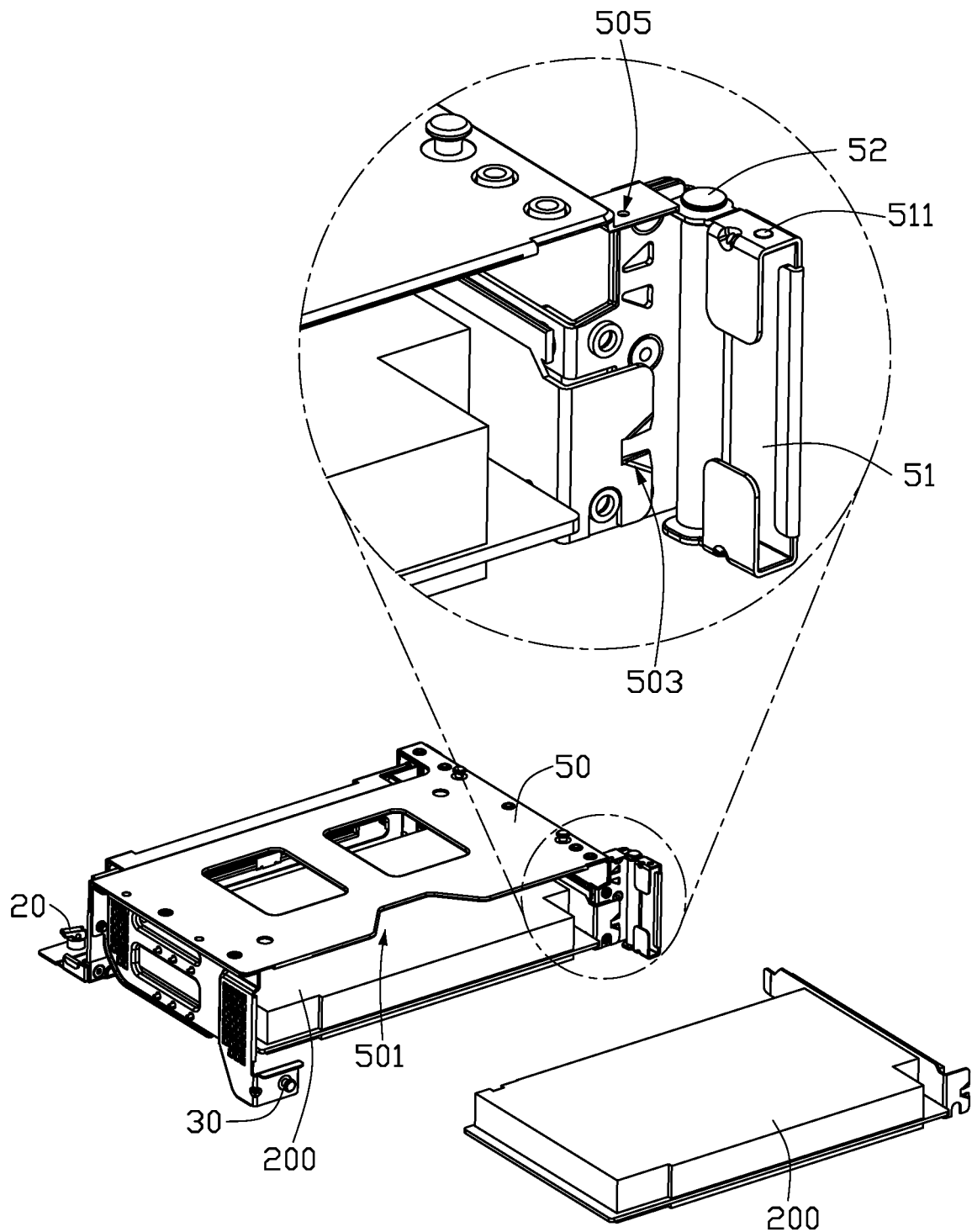
FIG. 5 is an isometric, exploded view of a holder and an expansion card shown in FIG. 1.

As shown in FIGS. 2, 3 and 5, a connected cavity 501 and a first opening 503 are defined on the holder 50 and are connected. After passing the first opening 503, the expansion card 200 enters the cavity 501. The fixture 100 comprises a fastener 51. The fastener 51 is rotatably positioned on the holder 50 and could be rotated to snap-fit attach to the holder 50. The fastener 51 stops the part of the first opening 503, and the fastener 51 and the holder 50 clamp and fix expansion card 200.

The fastener 51 rotates about an axis parallel to third direction Z. The expansion card 200 moves along the second direction Y to pass through the first opening 503 and enter the cavity 501. After inserting the expansion card 200 into the holder 50, observe along the third direction Z and rotate the fastener 51 clockwise, and the fastener 51 and the holder 50 snap together to clamp the expansion card 200. When it is necessary to remove the expansion card 200 from the holder 50, observe along the third direction Z and rotate the fastener 51 counterclockwise to release the buckle connection between the fastener 51 and the holder 50, allowing the expansion card 200 to be removed. The combination of the booster 51 and the holder 50 facilitates the quick tool free installation and disassembly of the expansion card 200 from the holder 50.

As shown in FIG. 3, the holder 50 is provided with a second shaft 52. A hole is defined on the fastener 51, and the hole matches the second shaft 52. The fastener 51 is threaded through the hole, and the fastener 51 could rotate around the second shaft 52.

The shape of the hole can be determined according to actual needs, and the shape of the hole is preferably circular.

A bucket hole 505 is defined on the holder 50, and the fastener 51 is provided with a bucket part 511. The buckle part 511 is connected to the buckle hole 505 to achieve a buckle connection between the holder 50 and the fastener 51.

In an embodiment, when the fastener 51 is snapped into the holder 50, the size of the fastener 51 on the third direction Z is approximately equal to the size of the holder 50 on the third direction Z. The Fastener 51 is a thin-walled structure, making it occupy little space in the width direction of the holder 50.

As shown in FIG. 1, the bracket 60 comprises first fixing plate 61, second fixing plate 62, and third fixing plate 63. The first fixing plate 61 stops the holder 50 in a direction perpendicular to the first direction X. The second fixing plate 62 stops the holder 50 in a direction perpendicular to the third direction Z. The third fixing plate 63 stops the holder 50 in a direction perpendicular to the second direction Y. The bracket 60 limits the displacement of the holder 50 in three directions: first direction X, second direction Y, and third direction Z, improving the reliability of the positioning of the holder 50 by the bracket 60.

As shown in FIGS. 1, 2 and 3, a window 615 is defined on the first fixing plate 61. The first fixing plate 61 comprises a top plate 611, a bottom plate 612, a first side plate 613, and a second side plate 614. The top plate 611, the bottom plate 612, the first side plate 613, and the second side plate 614 are surrounded by the window 615.

When the holder 50 is placed in the bracket 60, the fastener 51 passes through the window 615 and partially extends out of the window 615. The first side plate 613 contacts or is close to the fastener 51. The first side plate 613 limits the displacement of the fastener 51 to avoid the rotation of the fastener 51 causing the expansion card 200 to move away from the holder 50, improving the stability of the fixture 100 in fixing the expansion card 200.

As shown in FIGS. 1 and 3, in an embodiment, the first connector 10 is positioned on the holder 50. A first slot 12 is defined on the top plate 611. The first connector 10 is buckled into the first slot 12 to position the holder 50 and the first fixing plate 61 relative to each other on the third direction Z.

In an embodiment, the number of the first connectors 10 is two. The two first connectors 10 are positioned on the holder 50 along the second direction Y, which can increase the balance of the holder 50 during fixation, thereby increasing the fixation stability of the holder 50.

In another embodiment, the number of the first connectors 10 is such as three or four, which is not limited here.

In an embodiment, the first connector 10 comprises a first column part 111 and a first clamping part 112. The first column part 111 is connected to the holder 50. The first clamping part 112 is connected to the first column part 111.

The first column part 111 is inserted into the first slot 12. The first clamping part 112 is in contact with the top plate 611. The side of the first clamping part 112 facing the second fixing plate 62 contacts the side of the top plate 611 away from the second fixing plate 62, thereby preventing the first clamping part 112 and the top plate 611 from moving relative to each other along the third direction Z.

In an embodiment, the external diameter of the first column part 111 is smaller than the external diameter of the first clamping part 112. When the first column part 111 extends into the first slot 12 in the opposite direction of the first direction X, the first column part 111 and the holder 50 are located on the opposite sides of the first slot 12 along the third direction Z. The first column part 111 and holder 50 are stopped along the third direction Z on opposite sides of the top plate 611 to limit the relative movement of the holder 50 and bracket 60 along the third direction Z.

In an embodiment, the first slot 12 is a U-shaped groove. The opening of the first slot 12 is away from the top plate 611 along the first direction X. The first slot 12 is in a flared shape, allowing the first connector 10 to quickly slide into the first slot 12 in the opposite direction of the first direction X.

Figure 4:
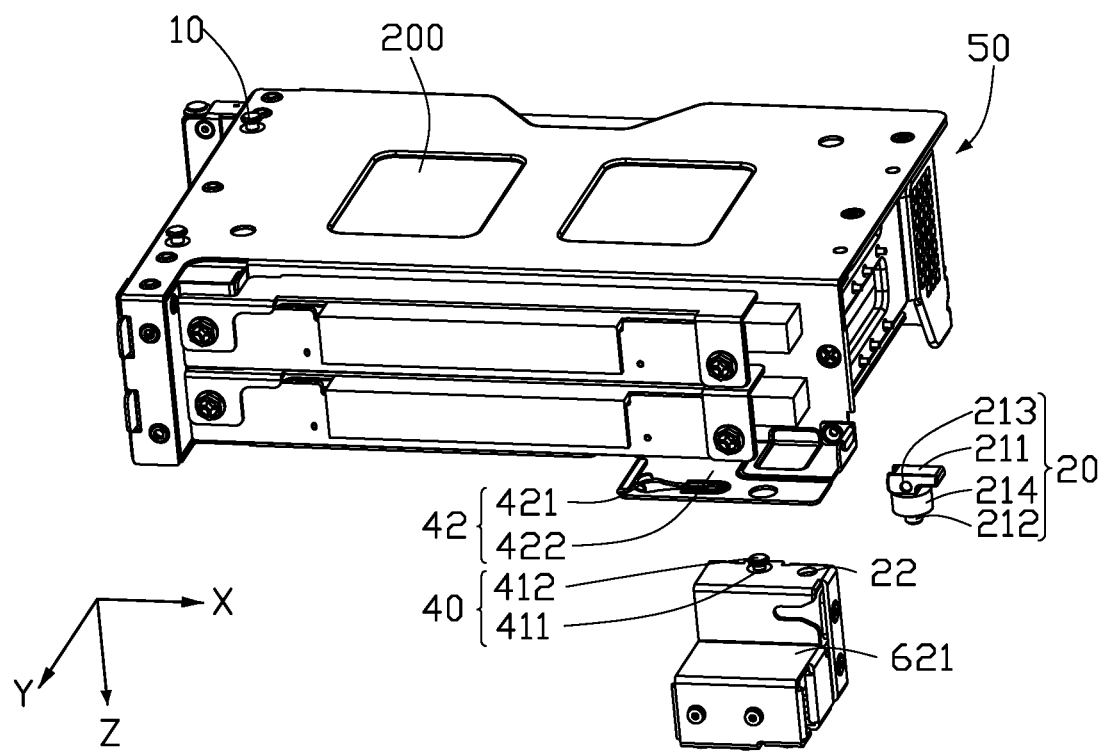
FIG. 4 is an isometric view of the holder shown in FIG. 3 at another angle.

As shown in FIGS. 1 and 4, in an embodiment, the second fixing plate 62 comprises a support frame 621 and a plate body 622. The plate body 622 is perpendicular to the third direction Z. The support frame 621 is fixedly connected to the plate body 622. The second connector 20 is positioned on the holder 50. A socket 22 is defined on the support frame 621. The second connector 20 is snapped into the socket 22 to connect the holder 50 and the support frame 621 along the first direction X, and further to connect the holder 50 and the bracket 60 along the first direction X.

In an embodiment, the second connector 20 is a quick release lock, and the socket 22 is a through-hole. The second connector 20 comprises a handle 211, a rod 212, a first shift 213, and a base 214. The first shaft 213 is connected to the rod 212. The rod 212 is slidably positioned at the base 214. The handle 211 rotates around the first shift 213. The handle 211 has an arcuate surface at one end near the base 214. When the handle 211 rotates around the first shaft 213, the arcuate surface slides on the side of the base 214 that is close to the handle 211, causing the first shaft 213 to approach or move away from the base 214 along the third direction Z. The first shift 213 drives the rod 212 to move in the opposite direction of the third direction Z or the third direction Z relative to the base 214.

Applying a force to the handle 211 causes the rod 212 driven by the first shift 213 to move relative to the base 214 along the third direction Z, and causes the rod 212 to enter the socket 22 along the third direction Z.

The rod 212 is blocked by the wall of the socket 22 to position the holder 50 and support frame 621 along the first direction X, enabling the connection between the holder 50 and the bracket 60.

Applying force to the handle 211 causes the first shift 213 to drive the rod 212 to move in the opposite direction of the third direction Z relative to the base 214, and causes the rod 212 to disengage from the socket 22. The holder 50 and the support frame 621 are disconnected, that is, the holder 50 and the bracket 60 are disconnected. The second connector 20 enables quick tool free connection or disassembly of the holder 50 and the second fixing plate 62.

As shown in FIGS. 2 and 3, in an embodiment, the fixture 100 further comprises a third connector 30. A third slot 32 is defined on the third fixing plate 63. The third connector 30 is fixedly connected to the holder 50. The connection between the third slot 32 and the third connector 30 enables the connection between the holder 50 and the third fixing plate 63 along the second direction Y.

In an embodiment, the third slot 32 comprises a second opening 321 and a sub slot 322. The second opening 321 is connected to the sub slot 322. The third connector 30 slides into the second opening 321 in the opposite direction of the first direction X and is positioned within the sub slot 322 to quickly connect holder 50 and third fixing plate 63 along second direction Y.

In an embodiment, the third connector 30 comprises a third column part 311 and a third clamping part 312. The third clamping part 312 connects to the third column part 311. The third column part 311 is connected to the holder 50. The third clamping part 312 is configured to snapped into the third slot 32.

In an embodiment, the external diameter of the third column part 311 is greater than the external diameter of the third clamping part 312. Two opposite walls of the third slot 32 are stopped along the third direction Z on the opposite sides of the third clamping part 312, and the third connector 30 and bracket 60 are positioned relative to each other along the third direction Z.

The second fixing plate 62 is stopped between the third column part 311 and the holder 50 to limit the displacement of the bracket 60 and the holder 50 along the second direction Y. When the third column part 311 slides into the sub slot 322 in the opposite direction of the first direction X, the sub slot 322 and the third clamping part 312 are coupled to achieve the connection of the holder 50 and the third fixing plate 63 along the second direction Y.

In another embodiment, the third connector 30 and the third slot 32 could be omitted, and the holder 50 is supported on the plate body 622; Alternatively, the displacement of the holder 50 could be limited along the third direction Z, and the first connector 10 is blocked along the reverse direction of the third direction Z by the portion of the bracket 60 on the peripheral side of the first slot 12, thus the bracket 60 limits the displacement of the holder 50 along the third direction Z.

As shown in FIGS. 2 and 4, in an embodiment, the fixture 100 further includes a fourth connector 40. A fourth slot 42 is defined on the holder 50. The fourth connector 40 is fixedly connected to the support frame 621. The snap fit of the fourth connector 40 and the fourth slot 42 further increases the stability of the connection between the holder 50 and the second fixing plate 62 along the third direction Z.

In an embodiment, the fourth slot 42 comprises interconnected wide mouth 421 and neck 422. The wide mouth 421 and the neck 422 are set along the first direction X. The fourth connector 40 comprises a second column part 411 and a second clamping part 412, and the second clamping part 412 connected to the second column part 411. The second column part 411 is connected to the support frame 621. The second clamping part 412 can pass through the wide mouth 421, and the second column part 411 moves from the wide south 421 to the neck 422 along the first direction X. The opposite two walls of the neck 422 stop at the opposite sides of the second column part 411 along the second direction Y.

The external diameter of the second column part 411 is smaller than the external diameter of the second clamping part 412. When the second column part 411 is located within the neck 422, the holder 50 stops between the second clamping part 412 and the support frame 621 to limit the relative displacement of the holder 50 and the support frame 621 along the third direction Z. The second clamping part 412 moves in the opposite direction of the third direction Z and can only extend from the wide mouth 421 into the fourth slot 42, but not from the neck 422 into the fourth slot 42.

In another embodiment, the fourth connector 40 and two walls of the fourth slot 42 do not contact along the second direction Y.

Moving the holder 50 along the first direction X causes the second column part 411 to move from the neck 422 to the wide south 421. When the second clamping part 412 is located at the wide south 421, it can make the second clamping part 412 pass through the wide south 421 along the third direction Z to achieve the separation of the fourth connector 40 from the fourth slot 42, and achieve the separation of the holder 50 and the second fixing plate 62.

The holder 50 moves along the first direction X to move the second column part 411 from the neck 422 to the wide edge 421. When the second clamping part 412 is located at the wide edge 421, the second clamping part 412 passes through the wide edge 421 along the third direction Z, achieving the separation of the fourth connector 40 from the fourth slot 42, and achieving the separation of the holder 50 and the second fixing plate 62.

In an embodiment, the bracket 60 is an electronic equipment cabinet. Some areas of the box serve as the first fixing plate 61, second fixing plate 62, and third fixing plate 63 of the bracket 60, and there is no need to additionally design the first fixing plate 61, second fixing plate 62, and third fixing plate 63, which saves materials and costs.

In another embodiment, the bracket 60 could be installed on the cabinet.

In an embodiment, the first connector 10, the third connector 30, and the fourth connector 40 have the same structure, facilitating mold opening and installation, and reducing costs.

In an embodiment, the first connector 10, the third connector 30, and the fourth connector 40 are I-shaped pins. The I-shaped pins can be purchased directly on the market without additional processing, saving mold opening costs.

The tool free quick installation process for the expansion card 200 includes the following steps:

Install the expansion card 200 into the holder 50. Observe it along the third direction Z, and rotate the fastener 51 clockwise, and the fastener 51 and the holder 50 cooperate to clamp the expansion card 200, thereby securing the expansion card 200 to the holder 50.

Thus, the second clamping part 412 of the fourth connector 40 passes through the wide south 421 of the fourth slot 42 in the opposite direction of the third direction Z, the holder 50 moves in the opposite direction of the first direction X, causing the second column part 411 to move into the nesting 422. The nesting 422 and the fourth connector 40 are coupled to achieve the connection between the holder 50 and the second fixing plate 62 along the third direction Z.

The third connector 30 on the holder 50 slides into the second opening 321 of the third slot 32 in the opposite direction of the first direction X and is located within the sub slot 322, enabling the holder 50 and the third fixing plate 63 to quickly connect along the second direction Y.

Press the handle 211 of the second connector 20 on the holder 50 to move the rod 212 along the third direction Z and insert rod 212 into the socket 22, and the holder 50 and the support frame 621 are connected along the first direction X to achieve the connection between the holder 50 and the second fixing plate 62, thereby completing the tool free quick installation of the expansion card 200.

The tool free quick disassembly process of the expansion card 200 includes the following steps:

Lift the handle 211 of the second connector 20 on the holder 50, and the rod 212 moves in the opposite direction of the third direction Z, leaving the socket 22. The holder 50 and the socket 22 are disconnected along the first direction X.

The holder 50 moves along the first direction X, causing the third connector 30 on the holder 50 to slide out of the sub slot 322 and exit the third slot 32 through the second opening 321. The connection between the holder 50 and the bracket 60 along the first direction X is released.

The first column part 111 of the first connector 10 on the holder 50 slides out of the first slot 12 along the first direction X, and the first connector 10 and the first slot 12 release the snap fit relationship along the second direction Y.

The fourth connector 40 slides along the first direction X from the connecting 422 into the wide mouth 421, and the second clamping part 412 exits the fourth slot 42 in the opposite direction of the third direction Z through the wide mouth 421, releasing the connection between the holder 50 and the bracket 60 along the third direction Z. The connection between the holder 50 and the bracket 60 is removed.

After taking out the holder 50, observe along the third direction Z and rotate the fastener 51 counterclockwise to keep the fastener 51 away from the expansion card 200, then take out the expansion card 200.

On another hand, the embodiment of this application provides an electronic equipment that includes the fixture 100 described above. The electronic equipment could quickly install and disassemble the expansion card 200 without using tools. The electronic equipment could be, but not limited to, personal computers and servers.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size and arrangement of the parts within the principles of the present disclosure, up to and including the full extent established by the broad general meaning of the terms used in the claims.

What is claimed is:

1. A fixture configured for fixing a structure with an expansion card, the fixture comprising:
    a holder configured to fix the expansion card;
    a bracket defining a first slot and a socket;
    a first connector positioned on the holder; and
    a second connector positioned on the holder, wherein
    the first connector enters the first slot along a first direction, and two walls of the first slot stop at opposite sides of the first connector along a second direction,
    the bracket supports the holder along a third direction,
    the second connector is insertable into the socket to restrict the holder from moving relative to the bracket along the first direction, and
    the first direction, the second direction, and the third direction are perpendicular to each other.

2. The fixture of claim 1, wherein:
    a first opening and a cavity are defined on the holder;
    the first opening is configured for the expansion card to extend through, and the cavity is configured to accommodates the expansion card;
    the fixture further comprises a fastener rotatable connected to the holder, the fastener being rotatable to snap fit the holder and block a portion of the first opening to clamp and fix the expansion card with the holder.

3. The fixture of claim 2, wherein:
    a window is defined on the bracket, the fastener is configured to extend through the window and extend out of the bracket; and
    the bracket on a peripheral side of the window prevents the fastener from rotating and prevents the expansion card from moving in a direction away from the holder.

4. The fixture of claim 1, wherein:
    the first connector comprises a first column part and a first clamping part;
    the first column part is connected to the holder, and the first clamping part is connected to the first column part;
    the first column part is configured to slide into the first slot, and the first clamping part stops along the third direction on a side of the bracket away from the holder.

5. The fixture of claim 1, wherein:
    the second connector comprises a handle, a rod, a first shift, and a base;
    the rod is slidably positioned on the base, the first shaft is connected to the rod, and the handle is rotationally connected to the first shaft;
    the handle has an arcuate surface, and when the handle rotates around the first shaft, the arcuate surface acts on the base to drive the first shaft and the rod to move relative to the base, in the third direction.

6. The fixture of claim 1, wherein:
    the fixture further comprises a third connector, and a third slot defined on the bracket;
    the third slot defines a second opening and a sub slot, and the third connector is fixedly connected to the holder;
    the third connector moves along the first direction and is inserted into the third slot from the second opening;
    two walls of the third slot stop at opposite sides of the third connector along the third direction.

7. The fixture of claim 6, wherein:
    the third connector comprises a third column part and a third clamping part, the third column part is connected to the third clamping part and the holder;
    the third clamping part stops along the second direction at a side of the bracket away from the holder.

8. The fixture of claim 6, wherein:
    the bracket comprises a first fixing plate, a second fixing plate, and a third fixing plate;
    the first fixing plate and the second fixing plate extend on a same side of the third fixing plate along the second direction;
    the first connector is positioned on the first fixing plate, the second connector is positioned on the second fixing plate; and the third connector is positioned on the third fixing plate.

9. The fixture of claim 1, the fixture further comprising a fourth connector connected to the bracket, wherein
    a fourth slot is defined on the holder, and the fourth connector is insertable into the fourth slot to limit displacements of the holder and the bracket along the third direction.

10. The fixture of claim 9, wherein:
    the fourth slot comprises a wide mouth and a neck sequentially arranged along the first direction;
    the fourth connector comprises a second column part and a second clamping part, the second column part is connected to the bracket, and the second clamping part is connected to the second column part;
    when the second gripping part moves through the wide mouth, and the second column part moves along the first direction to the neck, the second clamping part stops along the third direction on the side of the holder away from the bracket.

11. A fixture configured for fixing a structure with an expansion card, the fixture comprising:
    a holder configured to fix the expansion card;
    a bracket defining a first slot and a socket;
    a first connector positioned on the holder; and
    a second connector positioned on the holder, wherein
    the first connector enters the first slot along a first direction, and the first slot stop at opposite sides of the first connector along a second direction and a third direction,
    the bracket supports the holder along the third direction, the second connector is insertable into the socket to restrict the holder from moving relative to the bracket along the first direction, and the first direction, the second direction, and the third direction are perpendicular to each other.

12. A electronic equipment comprising:
an expansion card; and
A fixture comprising:
  a holder configured to fix the expansion card;
  a bracket defining a first slot and a socket;
  a first connector positioned on the holder; and
  a second connector positioned on the holder, wherein
    the first connector enters the first slot along a first direction, and two walls of the first slot stop at opposite sides of the first connector along a second direction,
    the bracket supports the holder along a third direction,
    the second connector is insertable into the socket to restrict the holder from moving relative to the bracket along the first direction, and
    the first direction, the second direction, and the third direction are perpendicular to each other.

13. The electronic equipment of claim 12, wherein:
a first opening and a cavity are defined on the holder;
the first opening is configured for the expansion card to extend through, and the cavity is configured to accommodates the expansion card;
the fixture further comprises a fastener rotatable connected to the holder, the fastener being rotatable to snap fit the holder and block a portion of the first opening to clamp and fix the expansion card with the holder.

14. The electronic equipment of claim 13, wherein:
a window is defined on the bracket, the fastener is configured to extend through the window and extend out of the bracket; and
the bracket on a peripheral side of the window prevents the fastener from rotating and prevents the expansion card from moving in a direction away from the holder.

15. The electronic equipment of claim 12, wherein:
the first connector comprises a first column part and a first clamping part;
the first column part is connected to the holder, and the first clamping part is connected to the first column part;
the first column part is configured to slide into the first slot, and the first clamping part stops along the third direction on a side of the bracket away from the holder.

16. The electronic equipment of claim 12, wherein:
the second connector comprises a handle, a rod, a first shift, and a base;
the rod is slidably positioned on the base, the first shaft is connected to the rod, and the handle is rotationally connected to the first shaft;
the handle has an arcuate surface, and when the handle rotates around the first shaft, the arcuate surface acts on the base to drive the first shaft and the rod to move relative to the base, in the third direction.

17. The electronic equipment of claim 12, wherein:
the fixture further comprises a third connector, and a third slot defined on the bracket;
the third slot defines a second opening and a sub slot, and the third connector is fixedly connected to the holder;
the third connector moves along the first direction and is inserted into the third slot from the second opening;
two walls of the third slot stop at opposite sides of the third connector along the third direction.

18. The electronic equipment of claim 17, wherein:
the third connector comprises a third column part and a third clamping part, the third column part is connected to the third clamping part and the holder;
the third clamping part stops along the second direction at a side of the bracket away from the holder.

19. The electronic equipment of claim 12, the fixture further comprising a fourth connector connected to the bracket, wherein:
a fourth slot is defined on the holder, and the fourth connector is insertable into the fourth slot to limit displacements of the holder and the bracket along the third direction.

20. The electronic equipment of claim 19, wherein:
the fourth slot comprises a wide mouth and a neck sequentially arranged along the first direction;
the fourth connector comprises a second column part and a second clamping part, the second column part is connected to the bracket, and the second clamping part is connected to the second column part;
when the second gripping part moves through the wide mouth, and the second column part moves along the first direction to the neck, the second clamping part stops along the third direction on the side of the holder away from the bracket.

* * * * *